United States Patent
Adachi et al.

(10) Patent No.: US 10,611,320 B2
(45) Date of Patent: Apr. 7, 2020

(54) WIRE HARNESS AND METHOD FOR PRODUCING EXTERIOR MEMBER OF WIRE HARNESS

(71) Applicant: YAZAKI CORPORATION, Tokyo (JP)

(72) Inventors: Hideomi Adachi, Shizuoka (JP); Shoji Masunari, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 109 days.

(21) Appl. No.: 14/687,244

(22) Filed: Apr. 15, 2015

(65) Prior Publication Data

US 2015/0217708 A1 Aug. 6, 2015

Related U.S. Application Data

(63) Continuation of application No. PCT/JP2013/079589, filed on Oct. 31, 2013.

(30) Foreign Application Priority Data

Oct. 31, 2012 (JP) .................................. 2012-241290

(51) Int. Cl.
*B60R 16/02* (2006.01)
*H02G 3/04* (2006.01)
(Continued)

(52) U.S. Cl.
CPC ....... *B60R 16/0215* (2013.01); *H02G 3/0468* (2013.01); *H05K 9/0098* (2013.01);
(Continued)

(58) Field of Classification Search
CPC ...... H02G 3/32; H02G 3/0215; H02G 3/0468; H02G 3/0616; H02G 3/0462;
(Continued)

(56) References Cited

U.S. PATENT DOCUMENTS 5,492,151 A * 2/1996 Wood ..................... F16L 11/111
138/121
5,850,855 A * 12/1998 Kerschbaumer ........ F16L 11/15
138/121
(Continued)

FOREIGN PATENT DOCUMENTS

CN 1209389 A 3/1999
CN 1734683 A 2/2006
(Continued)

OTHER PUBLICATIONS

International Search Report for PCT/JP2013/079589 dated Dec. 17, 2013.
(Continued)

*Primary Examiner* — Steven T Sawyer
*Assistant Examiner* — Paresh H Paghadal
(74) *Attorney, Agent, or Firm* — Kenealy Vaidya LLP

(57) ABSTRACT

A wire harness includes at least one conductive path, and an exterior member having a tubular shape and made of resin, the exterior member covering the conductive path. The exterior member includes a flexible tube portion with flexibility and a non-flexible tube portion with low flexibility lower than the flexibility of the flexible tube portion. At least one of the flexible tube portion and the non-flexible tube portion includes a thick portion and a thin portion which are arranged in a tube axis direction, the thick portion and the thin portion being different in thickness.

9 Claims, 13 Drawing Sheets

(51) Int. Cl.
    *H05K 9/00* (2006.01)
    *H05K 13/02* (2006.01)
    *H02G 3/32* (2006.01)
    *H02G 3/34* (2006.01)
    *H01B 7/00* (2006.01)
    *F16L 11/15* (2006.01)
    *F16L 11/11* (2006.01)
    *F16L 11/16* (2006.01)
    *F16L 11/14* (2006.01)

(52) U.S. Cl.
    CPC .......... *H05K 13/02* (2013.01); *B60R 16/0222* (2013.01); *F16L 11/11* (2013.01); *F16L 11/111* (2013.01); *F16L 11/14* (2013.01); *F16L 11/15* (2013.01); *F16L 11/16* (2013.01); *H01B 7/0045* (2013.01); *H02G 3/0462* (2013.01); *H02G 3/0475* (2013.01); *H02G 3/0481* (2013.01); *H02G 3/32* (2013.01); *H02G 3/34* (2013.01)

(58) Field of Classification Search
    CPC ................ H02G 3/0475; H02G 3/0481; B60R 16/0215; B60R 16/0222; F16L 11/11; F16L 11/111; F16L 11/14; F16L 11/15; F16L 11/16; H01B 7/0045
    See application file for complete search history.

(56) References Cited

U.S. PATENT DOCUMENTS

| | | | | |
|---|---|---|---|---|
| 6,024,130 | A * | 2/2000 | Tatsuta | F16L 11/15 138/110 |
| 6,666,415 | B2 * | 12/2003 | Hansen | F16B 2/06 248/74.1 |
| 8,230,885 | B2 * | 7/2012 | Krauss | F16L 11/11 138/109 |
| 8,525,029 | B2 | 9/2013 | Kato et al. | |
| 2001/0023767 | A1 * | 9/2001 | Berninger | H02G 3/0468 174/480 |
| 2004/0187947 | A1 * | 9/2004 | Heo | F16L 11/111 138/121 |
| 2006/0035533 | A1 | 2/2006 | Yamano et al. | |
| 2006/0191585 | A1 * | 8/2006 | Mori | F16L 11/11 138/121 |
| 2007/0012374 | A1 * | 1/2007 | Yasuda | F16L 11/11 138/121 |
| 2009/0308479 | A1 * | 12/2009 | Krauss | F16L 11/11 138/118 |
| 2010/0147557 | A1 * | 6/2010 | Suzuki | B60R 16/0222 174/153 G |
| 2011/0120747 | A1 * | 5/2011 | Muneyasu | B60R 16/0207 174/113 R |
| 2011/0132638 | A1 | 6/2011 | Oga et al. | |
| 2011/0155458 | A1 * | 6/2011 | Kato | B60R 16/0215 174/74 R |

FOREIGN PATENT DOCUMENTS

| | | | |
|---|---|---|---|
| CN | 102136706 A | 7/2011 | |
| JP | 2001-124248 A | 5/2001 | |
| JP | 2009143326 | * 2/2009 | ............ B60R 16/02 |
| JP | 2009-183013 A | 8/2009 | |
| JP | 2010-51042 A | 3/2010 | |
| JP | 2010-260241 A | 11/2010 | |
| JP | 2012-210101 A | 10/2012 | |

OTHER PUBLICATIONS

Japanese Office Action for the related Japanese Patent Application No. 2012-241290 dated May 19, 2016.
English language Written Opinion of the International Search Report for PCT/JP2013/079589 dated Dec. 17, 2013.
Chinese Office Action for the related Chinese Patent Application No. 201380057300.7 dated Sep. 1, 2016.
Chinese Office Action for the related Chinese Patent Application No. 201380057300.7 dated Apr. 6, 2017.

* cited by examiner

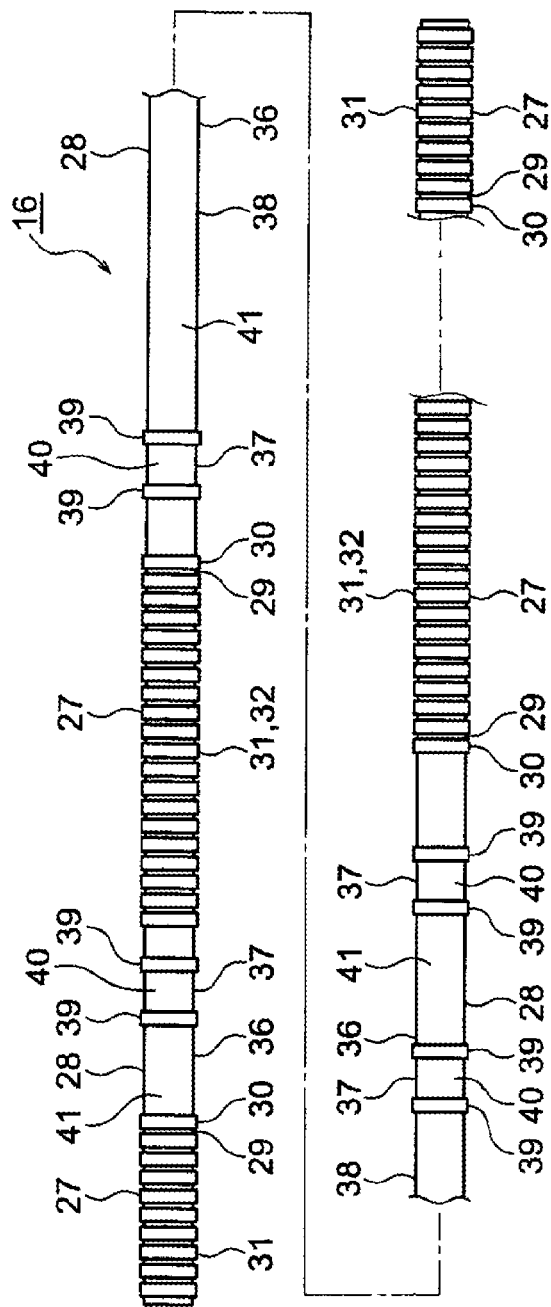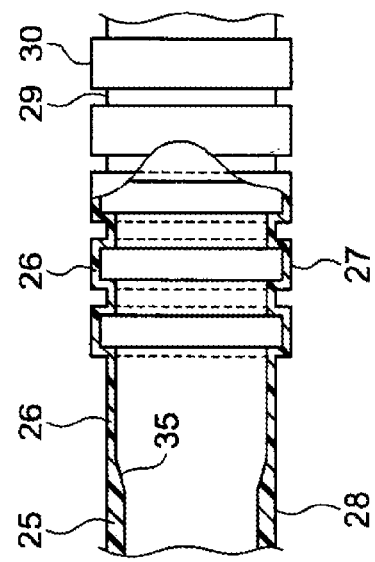
FIG.3A
FIG.3B

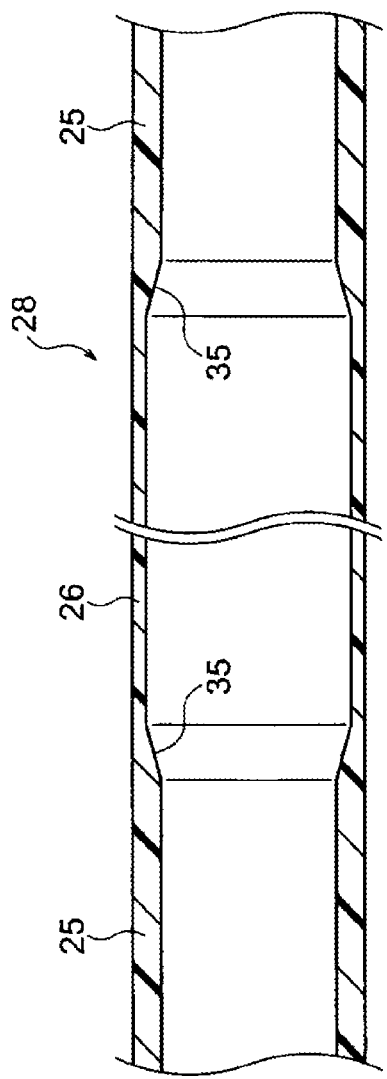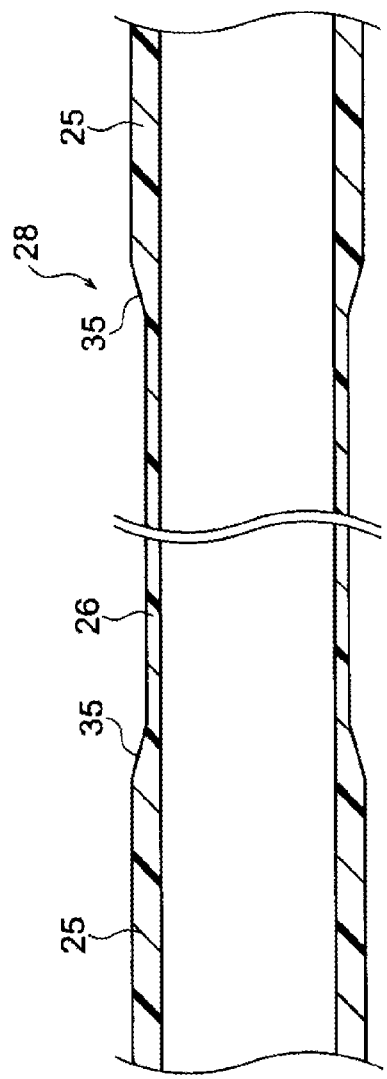

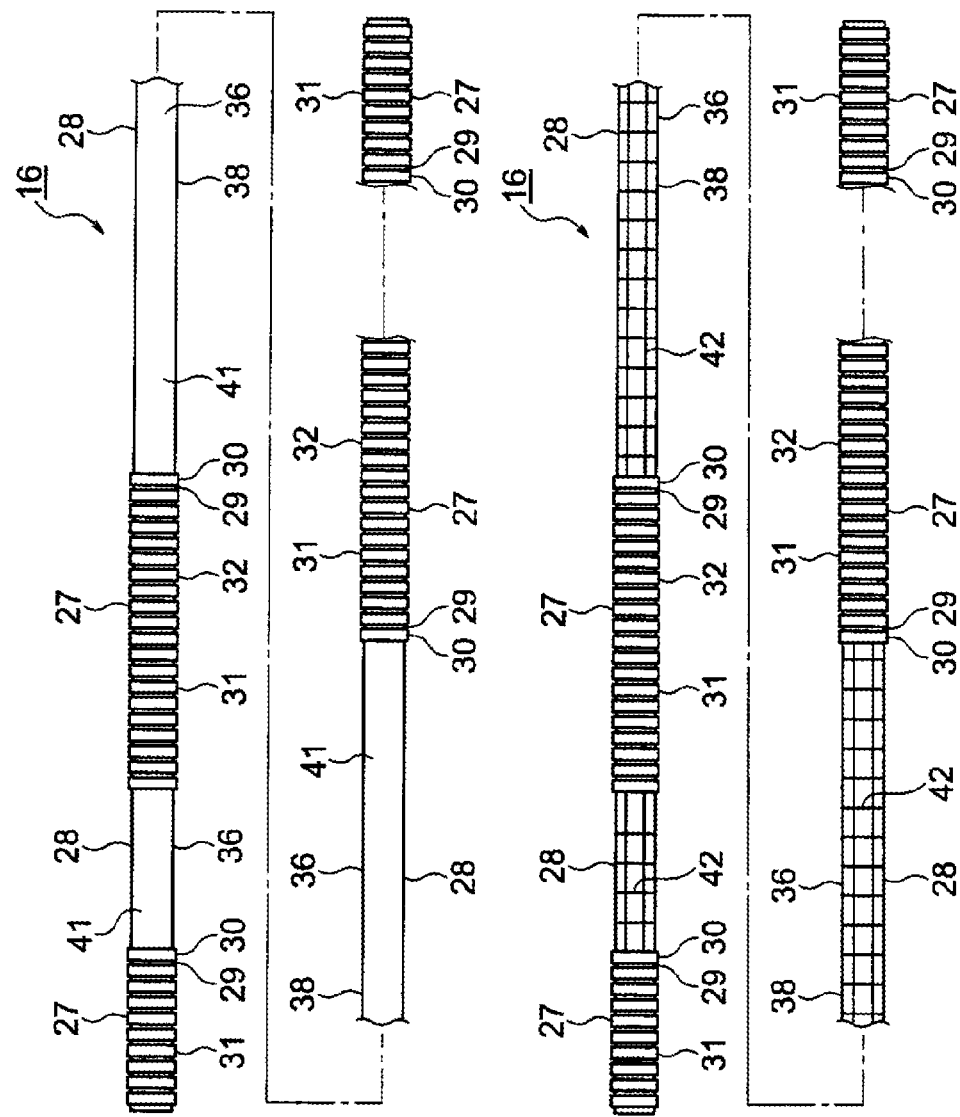

WIRE HARNESS AND METHOD FOR PRODUCING EXTERIOR MEMBER OF WIRE HARNESS

CROSS REFERENCE TO RELATED APPLICATION

This application is a continuation of PCT application No. PCT/JP2013/079589, which was filed on Oct. 31, 2013 based on Japanese Patent Application (No. 2012-241290) filed on Oct. 31, 2012, the contents of which are incorporated herein by reference. Also, all the references cited herein are incorporated as a whole.

BACKGROUND

1. Technical Field

The present invention relates to a wire harness including a conductive path and an exterior member, and a method for producing the exterior member.

2. Description of the Related Art

As a background-art wire harness, there has been known a wire harness that establishes an electric connection between high tension (i.e. for high voltage) devices in a hybrid car or an electric car.

A wire harness disclosed in JP-A-2010-51042 includes a plurality of conductive paths, corrugated tubes made of resin, and protectors made of resin. The corrugated tubes and the protectors accommodate the conductive paths collectively. Each corrugated tube is formed into a bellows tube shape having flexibility, and a plurality of corrugated tubes are provided on the wire harness so that the corrugated tubes are arranged in the longitudinal direction of the wire harness. The protectors are disposed in portions where the route of the wire harness must be restricted. In addition, the protectors are provided in positions where adjacent ones of the corrugated tubes are coupled with each other. The corrugated tubes and the protectors are used as exterior members.

Since the wire harness configured thus can be bent in the portions of the corrugated tubes, the wire harness can be transported in a compact form.

Each corrugated tube constituting the aforementioned background-art wire harness is molded out of resin with even thickness as a whole. In this manner, it has not been considered to increase the thickness partially in order to increase the strength or to reduce the thickness partially in order to increase speed in a process relating to resin molding if it is not necessary to increase the strength.

SUMMARY

The present invention has been developed in consideration of the aforementioned circumstances. An object of the invention is to provide a wire harness capable of improving the performance of an exterior member or the productivity thereof, and a method for producing the exterior member.

The present inventor believes that it is effective in attaining the aforementioned object to increase or reduce the thickness of an exterior member partially, for example, in a part that will be straight and long when it is wired or, for example, in a part that should be bent when it is wired.

In order to attain the aforementioned object, a wire harness and a method for producing an exterior member of the wire harness according to the invention are characterized in the following paragraphs (1) to (6).
(1) A wire harness including:
  at least one conductive path; and
  an exterior member having a tubular shape and made of resin, the exterior member covering the conductive path,
  wherein the exterior member includes a flexible tube portion with flexibility and a non-flexible tube portion with low flexibility lower than the flexibility of the flexible tube portion; and
  wherein at least one of the flexible tube portion and the non-flexible tube portion includes a thick portion and a thin portion which are arranged in a tube axis direction, the thick portion and the thin portion being different in thickness.

The wire harness according to the aforementioned paragraph (1) includes, in its configuration, an exterior member including a flexible tube portion and a non-flexible tube portion, and at least one of the flexible tube portion and the non-flexible tube portion includes a thick portion and a thin portion. The thick portion serves as a part that is intended to increase strength, rigidity, etc. in at least one of the flexible tube portion and the non-flexible tube portion. On the other hand, the thin portion serves as a part that is intended to increase the speed of a process relating to resin molding in at least one of the flexible tube portion and the non-flexible tube portion, a part that reduces the usage of a resin material, and a part that enhancing the flexibility. As a result, according to the wire harness in the aforementioned paragraph (1), it is possible to improve the performance of the exterior member or improve the productivity thereof.

(2) A wire harness according to the aforementioned paragraph (1), wherein the exterior member is formed by integral molding of the flexible tube portion and the non-flexible tube portion.

According to the wire harness in the aforementioned paragraph (2), the exterior member is formed as one component by the integral molding, for example, even when the exterior member is long. As a result, according to the wire harness in the aforementioned paragraph (2), it is possible to form the exterior member out of a reduced number of components.

(3) A wire harness according to the aforementioned paragraph (1), wherein the exterior member is formed by integration of the flexible tube portion and the non-flexible tube portion that have been formed to be divided.

According to the wire harness in the aforementioned paragraph (3), for example, a plurality of short tubes are formed and then integrated so that the exterior member can be formed as a single long tube. When a plurality of short tubes are formed, a resin molding apparatus can be miniaturized. In addition, according to the wire harness in the aforementioned paragraph (3), the thick portion and the thin portion are molded separately and then integrated so that the flexible tube portion or the non-flexible tube portion can be formed with a predetermined length. Thus, it is easy to form the flexible tube portion or the non-flexible tube portion including the thick portion and the thin portion. As a result, according to the wire harness in the aforementioned paragraph (3), it is possible to miniaturize the resin molding apparatus for the exterior member. In addition, it is possible to form the flexible tube portion or the non-flexible tube portion easily.

(4) A wire harness according to the aforementioned paragraph (2) or (3), wherein the thin portion is disposed in a part of the non-flexible tube portion to which the flexible tube portion is connected.

According to the wire harness in the aforementioned paragraph (4), the exterior member is formed to have less change in thickness in a part where the flexible tube portion and the non-flexible tube portion are connected. Due to the less change in thickness, the flexible tube portion can be formed easily with stable thickness. Due to the stable thickness of the flexible tube portion, the flexible tube portion can exert good flexibility. In this manner, according to the wire harness in the aforementioned paragraph (4), it is possible to stabilize the shape of the part where the flexible tube portion and the non-flexible tube portion are connected in the exterior member. In addition, it is possible to stabilize the thickness of the flexible tube portion.

(5) A method for producing an exterior member of a wire harness, including:

molding the exterior member of the wire harness out of resin, the exterior member having a tubular shape to cover at least one conductive path, the exterior member including a flexible tube portion with flexibility and a non-flexible tube portion with low flexibility lower than the flexibility of the flexible tube portion, at least one of the flexible tube portion and the non-flexible tube portion having a thick portion and a thin portion which are arranged in a tube axis direction, the thick portion and the thin portion being different in thickness, wherein variable control is performed on a moving speed of a mold block for molding the thick portion and the thin portion when the thick portion and the thin portion are formed.

According to the method for producing the exterior member of the wire harness in the aforementioned paragraph (5), the exterior member constituting the wire harness includes a flexible tube portion and a non-flexible tube portion, and at least one of the flexible tube portion and the non-flexible tube portion has a thick portion and a thin portion. The thick portion and the thin portion are formed by variable control on the moving speed of a mold block. Specifically, the moving speed of the mold block is increased to form the thin portion, and the moving speed is reduced to form the thick portion. In addition, according to the method for producing the exterior member of the wire harness in the aforementioned paragraph (5), due to the variable control on the moving speed of the mold block, the thick portion is formed, for example, only in a necessary part (or site). That is, the thick portion is not formed in any unnecessary part. Thus, a part where much time will be spent for molding the part can be minimized. Accordingly, it is possible to increase the speed of a process relating to resin molding and it is also possible to reduce the usage of a resin material. As a result, according to the method for producing the exterior member of the wire harness in the aforementioned paragraph (5), it is possible to improve the performance of the exterior member or the productivity thereof.

(6) A method for producing an exterior member of a wire harness, including:

molding the exterior member of the wire harness out of resin, the exterior member having a tubular shape to cover at least one conductive path, the exterior member including a flexible tube portion with flexibility and a non-flexible tube portion with low flexibility lower than the flexibility of the flexible tube portion, at least one of the flexible tube portion and the non-flexible tube portion having a thick portion and a thin portion which are arranged in a tube axis direction, the thick portion and the thin portion being different in thickness, wherein variable control is performed on a supply rate of a resin material to a mold block for molding the thick portion and the thin portion when the thick portion and the thin portion are formed.

According to the method for producing the exterior member of the wire harness in the aforementioned paragraph (6), the exterior member constituting the wire harness includes a flexible tube portion and a non-flexible tube portion, and at least one of the flexible tube portion and the non-flexible tube portion has a thick portion and a thin portion. The thick portion and the thin portion are formed by variable control on the supply rate of a resin material to a mold block. Specifically, the supply rate of the resin material to the mold block is increased to form the thick portion, and the supply rate is reduced to form the thin portion. In addition, according to the method for producing the exterior member of the wire harness in the aforementioned paragraph (6), due to the variable control on the supply rate of the resin material, the thick portion is formed only in a necessary part (or site). Since the thick portion is formed only in the necessary part, it is possible to reduce the usage of the resin material. As a result, according to the method for producing the exterior member of the wire harness in the aforementioned paragraph (6), it is possible to improve the performance of the exterior member or the productivity thereof.

BRIEF DESCRIPTION OF THE DRAWINGS

FIG. 3A is a configuration view of an exterior member, and FIG. 3B is a main portion sectional view of FIG. 3A.

FIG. 5A and FIG. 5B are longitudinal sectional views of a non-flexible tube portion.

FIG. 6A and FIG. 6B are views showing modifications of the exterior member.

DETAILED DESCRIPTION OF THE EXEMPLARY EMBODIMENTS

A wire harness according to the invention includes at least one conductive path, and an exterior member having a tubular shape and made of resin to cover the conductive path. The exterior member includes a thick portion and a thin portion arranged in a tube axis direction. The thick portion and the thin portion are different in thickness. The thick portion and the thin portion are formed by variable control on the moving speed of a mold block or a supply rate of a resin material to the mold block during resin molding of the exterior member.

First Embodiment

Figure 1:
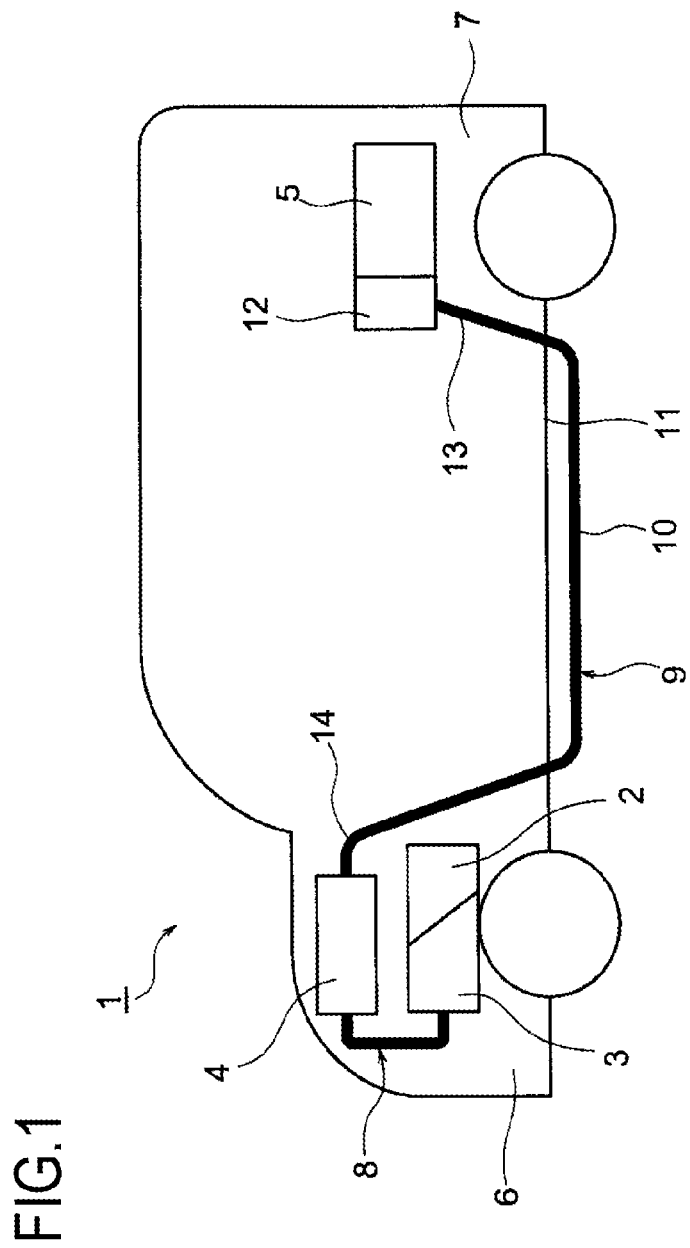
FIG. 1 is a schematic view showing a state where a wire harness according to a first embodiment is wired.

A first embodiment of a wire harness according to the invention will be described below with reference to FIGS. 1 to 11. FIG. 1 is a schematic view showing a state where the wire harness according to the first embodiment is wired.

Figure 2:
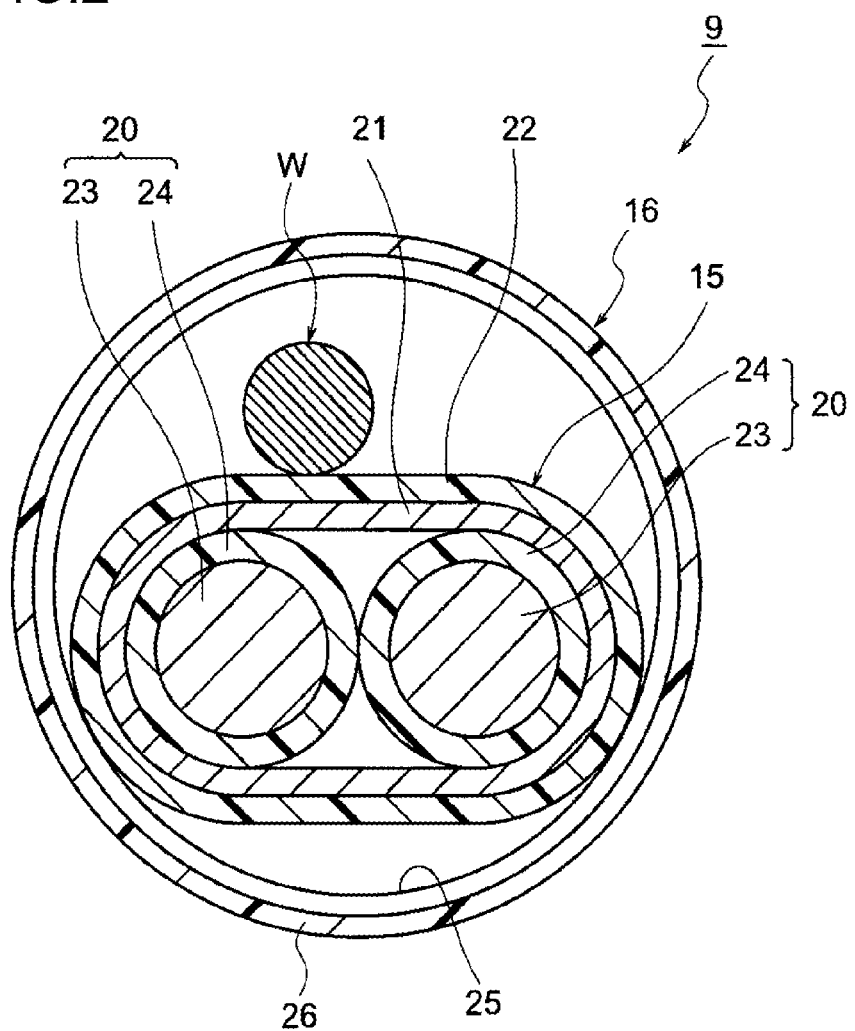
FIG. 2 is a cross sectional view of the wire harness.
Figure 4:
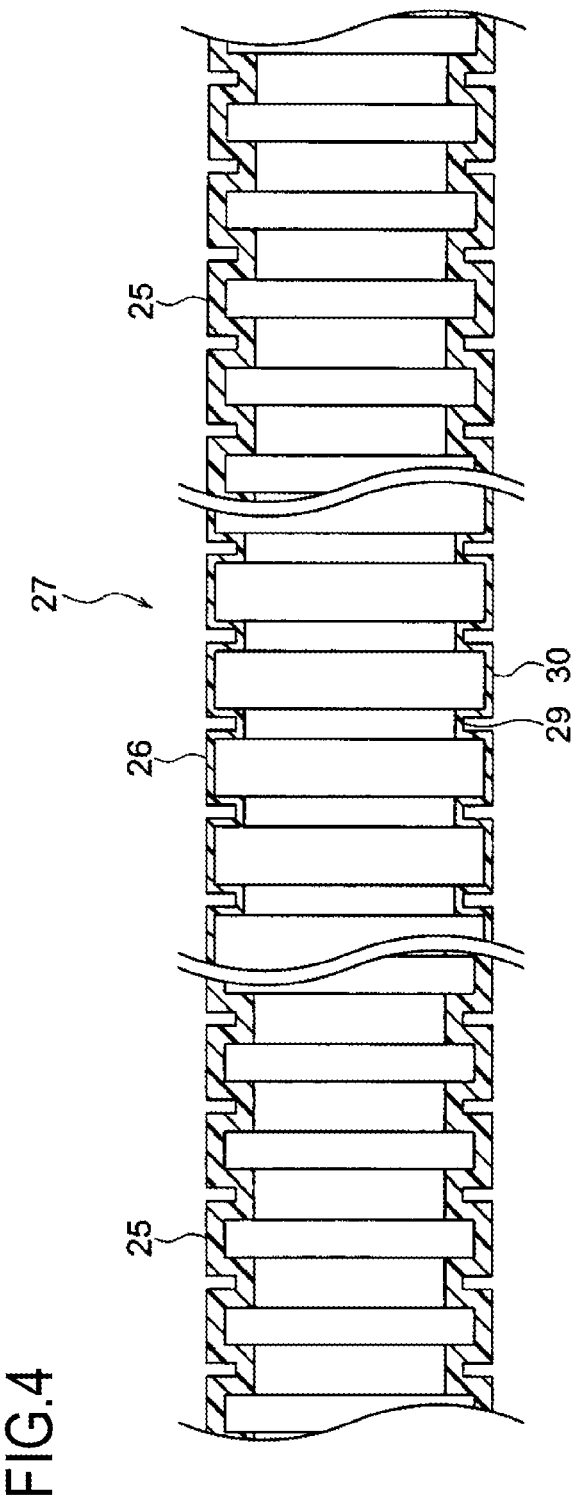
FIG. 4 is a longitudinal sectional view of a flexible tube portion.
Figure 7:
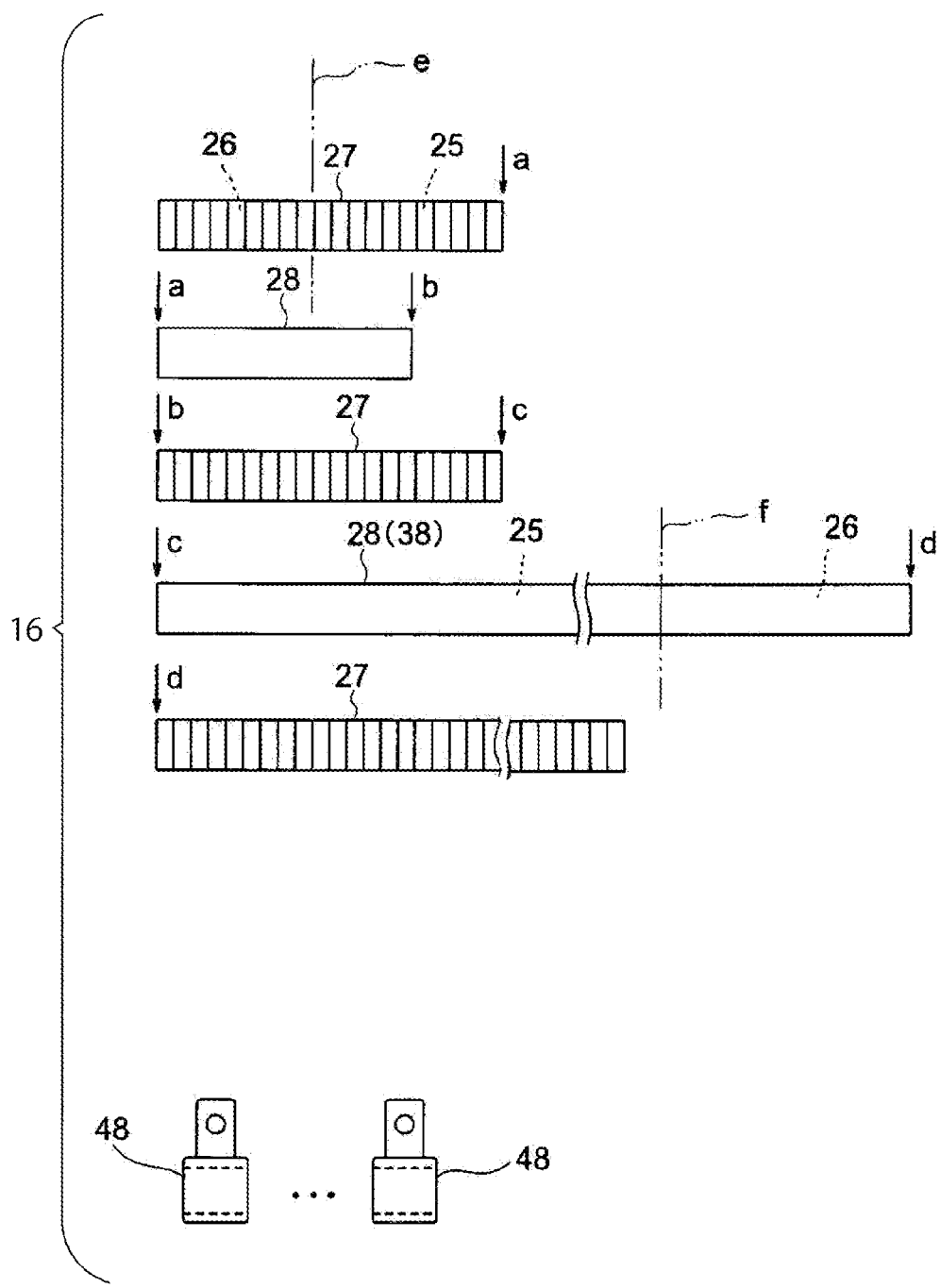
FIG. 7 is a view showing a modification of the exterior member.
Figure 8:
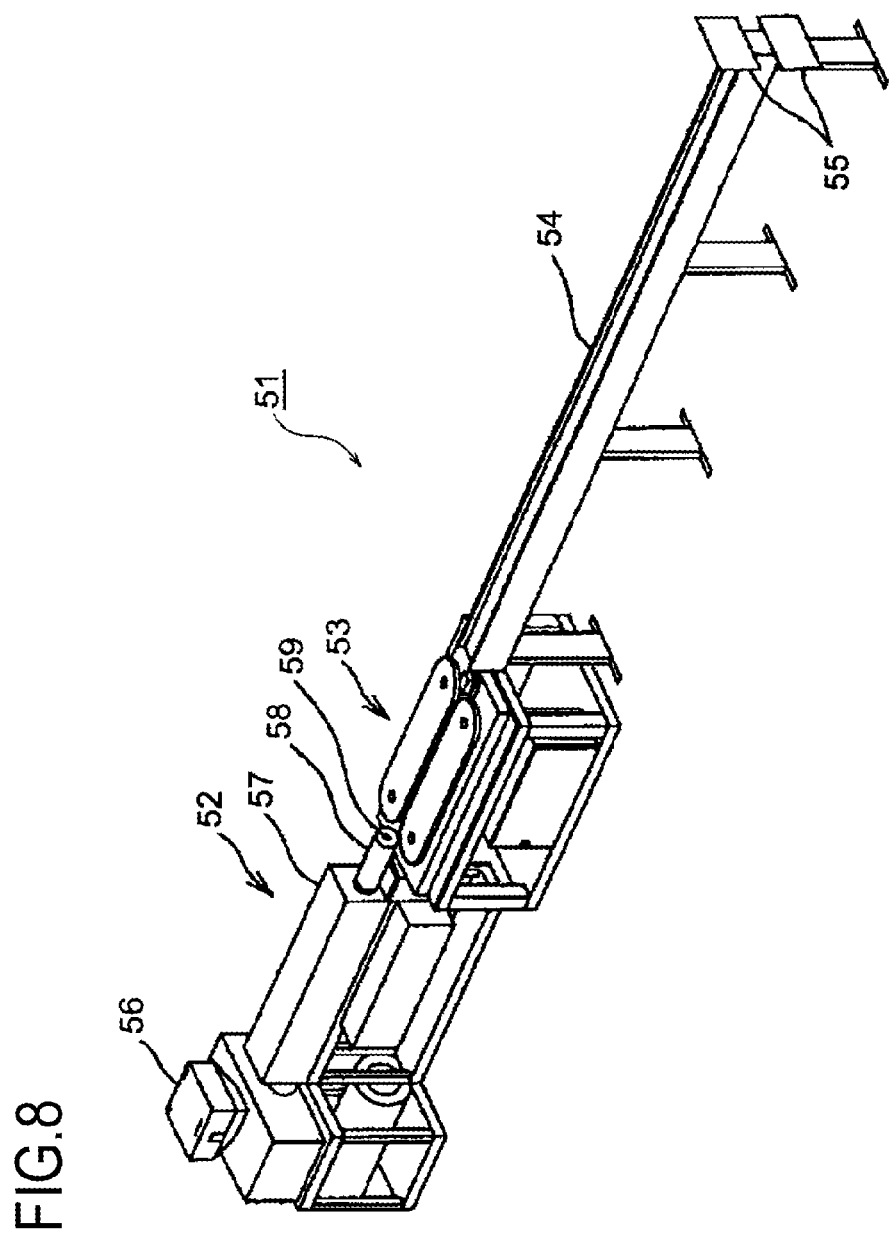
FIG. 8 is a perspective view showing an apparatus for producing the exterior member.
Figure 9:
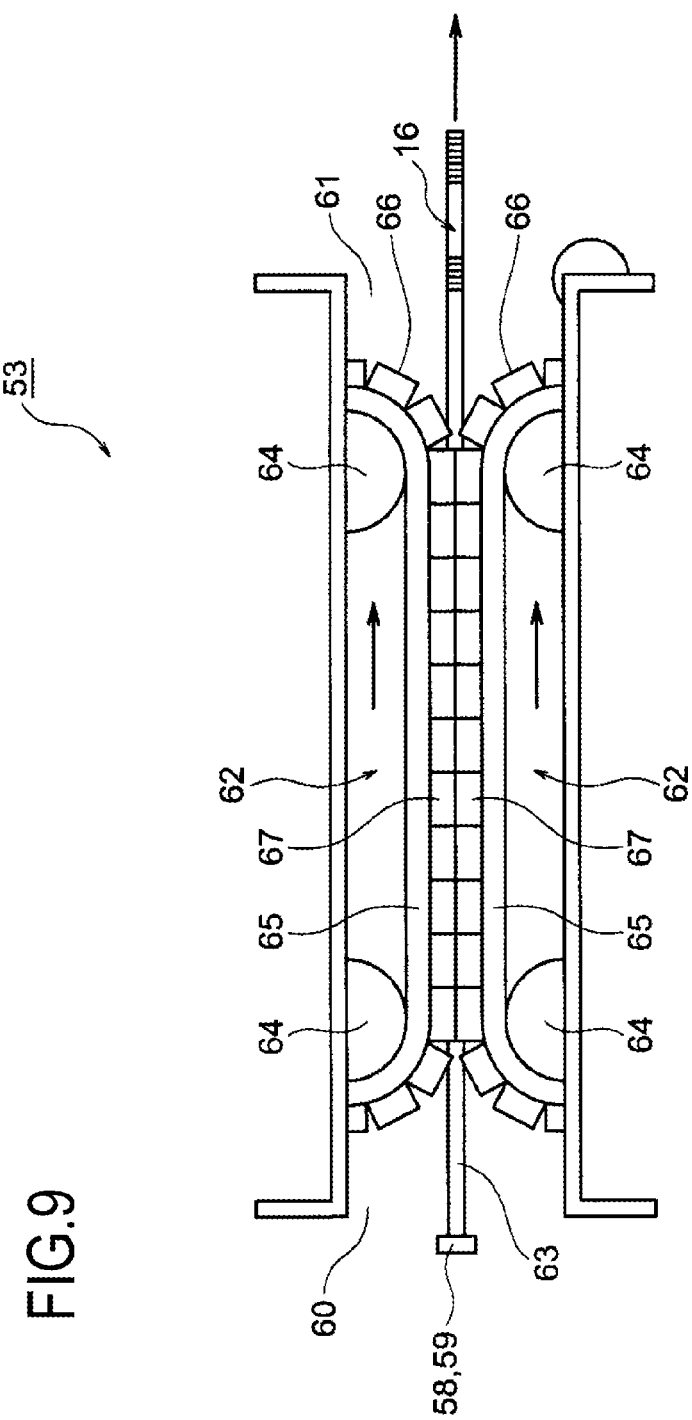
FIG. 9 is a plan view showing a main portion of the producing apparatus in FIG. 8.
Figure 10:
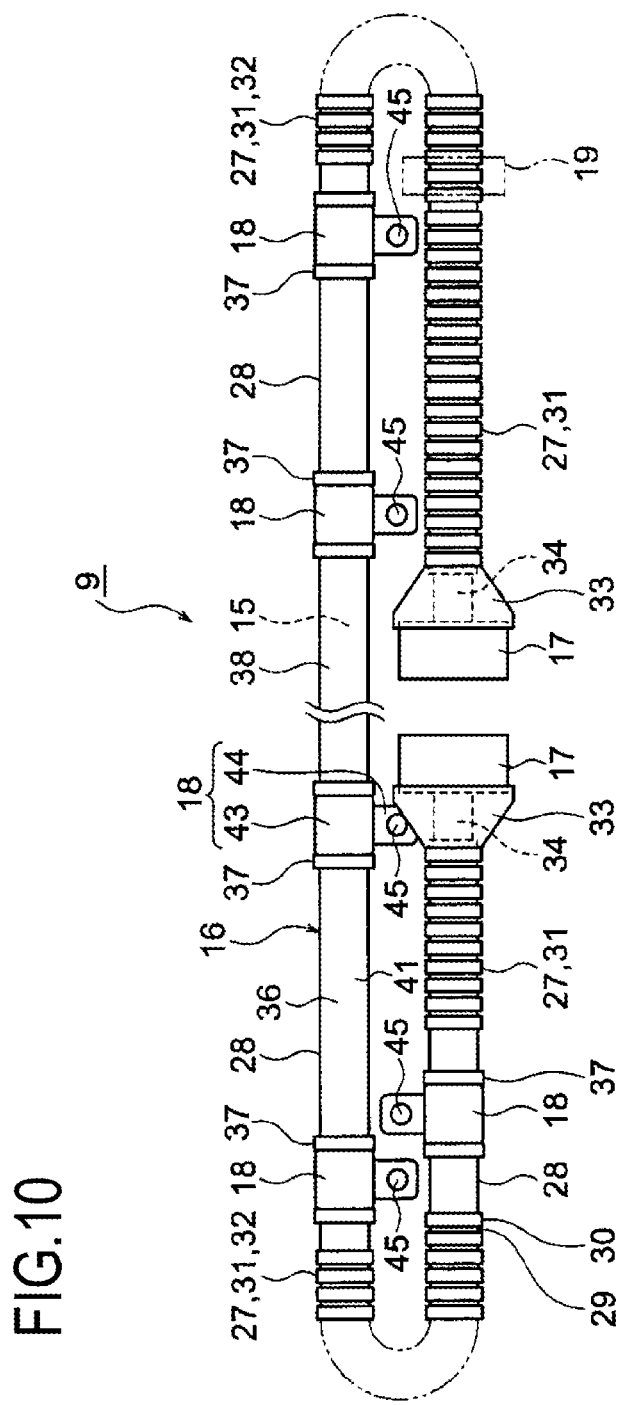
FIG. 10 is a view showing the wire harness that is being transported.
Figure 11:
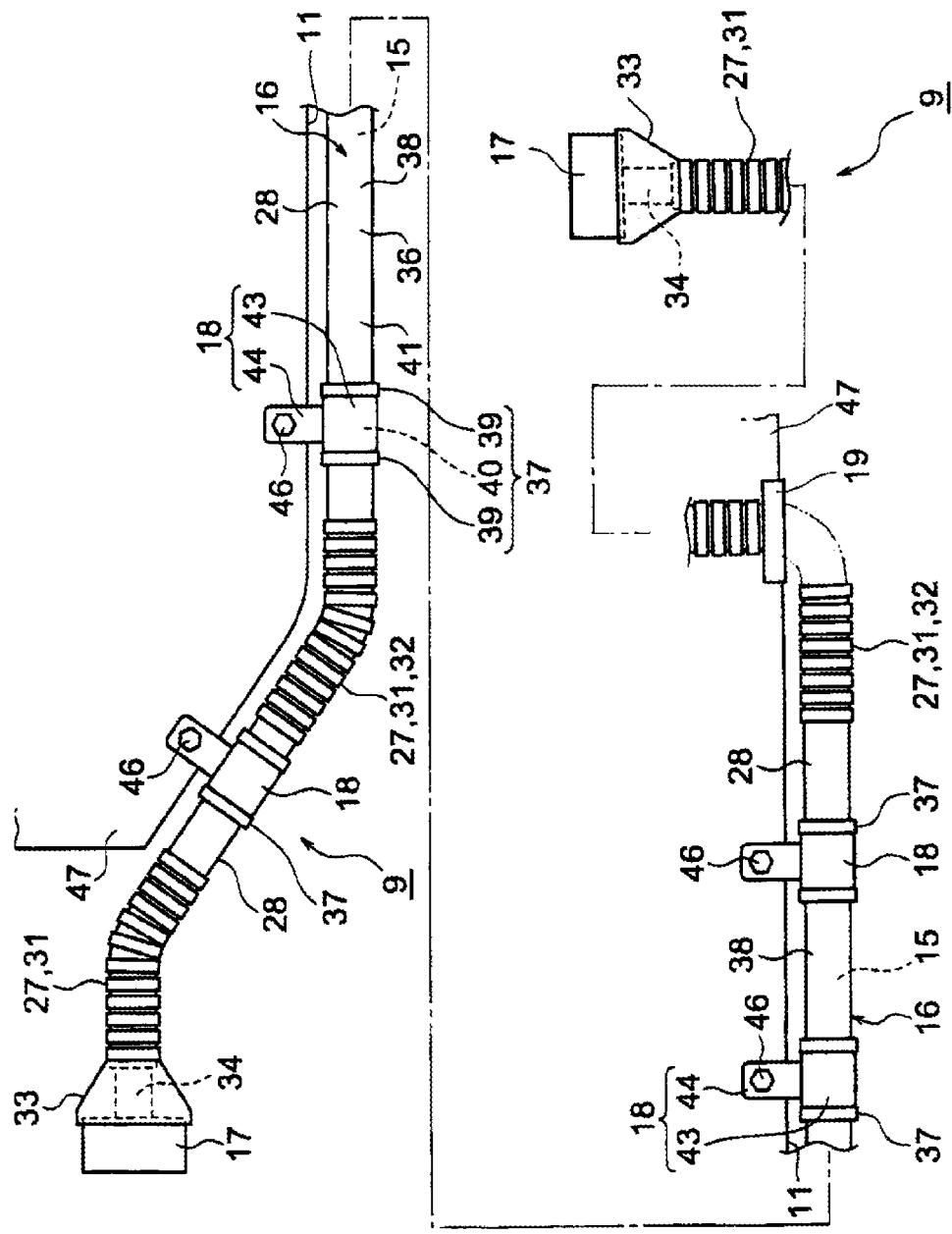
FIG. 11 is a view showing the wire harness during wiring path arrangement.

FIG. 2 is a cross sectional view of the wire harness. FIG. 3A is a configuration view of an exterior member, and FIG. 3B is a main portion sectional view of FIG. 3A. FIG. 4 is a longitudinal sectional view of a flexible tube portion. FIG. 5A and FIG. 5B are longitudinal sectional views of a non-flexible tube portion. FIG. 6A, FIG. 6B and FIG. 7 are views showing modifications of the exterior member. FIG. 8 is a perspective view showing an apparatus for producing the exterior member. FIG. 9 is a plan view showing a main portion of the producing apparatus in FIG. 8. FIG. 10 is a view showing the wire harness that is being transported. FIG. 11 is a view showing the wire harness during wiring path arrangement.

The first embodiment will be described along an example in which the invention is applied to a wire harness wired in a hybrid car (which may be replaced by an electric car or a general car).

In FIG. 1, the reference numeral 1 represents a hybrid car. The hybrid car 1 is a vehicle that is driven by a mixture of two power sources, that is, an engine 2 and a motor unit 3. To the motor unit 3, electric power is supplied from a battery 5 (or a battery pack) through an inverter unit 4. In this example, the engine 2, the motor unit 3 and the inverter unit 4 are mounted in an engine room 6 close to front wheels etc. On the other hand, the battery 5 is mounted in a car rear portion 7 close to rear wheels etc. Incidentally, the battery 5 may be mounted in a car cabin that is located at the rear of the engine room 6.

The motor unit 3 and the inverter unit 4 are electrically connected through a high voltage wire harness 8. In addition, the battery 5 and the inverter unit 4 are also electrically connected through a high voltage wire harness 9. An intermediate portion 10 of the wire harness 9 is wired in a vehicle underfloor 11. In addition, the wire harness 9 is wired substantially in parallel with the vehicle underfloor 11. The vehicle underfloor 11 is a well-known body that is a so-called panel member. Through holes 11a are formed in predetermined positions of the vehicle underfloor 11. The wire harness 9 is inserted into one of the through holes 11a.

The wire harness 9 and the battery 5 are electrically connected through a junction block 12 that is provided in the battery 5. A rear end 13 of the wire harness 9 is electrically connected to the junction block 12 by a well-known method. On the other hand, a front end 14 of the wire harness 9 is electrically connected to the inverter unit 4 by a well-known method.

The motor unit 3 has a motor (not shown) and a generator (not shown). On the other hand, the inverter unit 4 has an inverter (not shown) and a converter (not shown). The motor unit 3 is formed as a motor assembly including a shield case (not shown). The inverter unit 4 is also formed as an inverter assembly including a shield case (not shown). The battery 5 is a modularized one based on Ni-MH or Li-ion. For example, an electric storage device such as a capacitor may be used. The battery 5 is not limited especially as long as it can be used in the hybrid car 1 or an electric car.

First, the configuration and structure of the wire harness 9 will be described.

In FIG. 2, the wire harness 9 has a high voltage conductive path 15 (that is, a conductive path), an exterior member 16 for accommodating and protecting the high voltage conductive path 15, shield connectors 17 (that is, connection members. See FIG. 10 and FIG. 11.) that are provided on terminals of the high voltage conductive path 15, a plurality of clamps 18 (that is, fixation members. See FIG. 10 and FIG. 11.) that are attached to the outer surface of the exterior member 16, and grommets 19 (that is, water stop members. See FIG. 10 and FIG. 11.) that are watertightly attached to the outer surface of the exterior member 16 in the same manner.

Incidentally, the wire harness 9 may be arranged so that a low voltage conductive path can be accommodated and protected by the exterior member 16 together with the high voltage conductive path 15. In this case, the low voltage conductive path is, for example, disposed in a position designated by the reference sign W in FIG. 2.

The high voltage conductive path 15 has two high voltage circuits 20, a shield member 21 that covers the two high voltage circuits 20, and a sheath 22 that is provided on the outer side of the shield member 21. This configuration of the high voltage conductive path 15 is simply an example.

Each high voltage circuit 20 is a well-known high voltage electric wire, which has a conductor 23 and an insulator 24 the conductor 23 is coated with. The high voltage circuit 20 has a length required for electric connection. The high voltage circuit 20 is formed to be so long that the wire harness 9 can electrically connect the inverter unit 4 and the battery 5 (or the junction block 12) with each other (see FIG. 1).

The conductor 23 is produced out of copper, a copper alloy, aluminum, or an aluminum alloy. The conductor 23 may have a conductor structure that consists of twisted strands or a rod-like conductor structure that is rectangular or circular in section (for example, a conductor structure that serves as a rectangular single core or a circular single core. In this case, the electric wire itself also has a rod-like shape). The insulator 24 made of an insulating resin material is formed on the outer surface of the aforementioned conductor 23 by extrusion molding.

Incidentally, the configuration of a well-known high voltage electric wire is, though not limited thereto, used as the high voltage circuit 20 in the first embodiment. That is, a high voltage circuit in which an insulator is provided in a well-known bus bar, or the like, may be used as the high voltage circuit 20.

The shield member 21 is an electromagnetic shield member (that is, an anti-electromagnetic wave shield member) that covers the two high voltage circuits 20 collectively. A well-known braid that consists of a large number of strands braided into a cylindrical shape is used as the shield member 21. The shield member 21 is formed to be substantially as long as the whole length of the two high voltage circuits 20. An end portion of the shield member 21 is electrically connected to a shield case or the like (not shown) of the inverter unit 4 (see FIG. 1) through the shield connector 17 (see FIG. 10 and FIG. 11).

As the shield member 21, for example, metal foil having electric conductivity or a member including the metal foil may be used as long as it can take a measure against electromagnetic waves.

The sheath 22 is formed by extrusion molding out of an insulating resin material into a predetermined thickness on the outer side of the shield member 21. The sheath 22 is disposed in a position corresponding to an outermost layer of the high voltage conductive path 15. The sheath 22 is subjected to terminal processing during the production of the wire harness 9 so that the shield member 21 can be exposed with a predetermined length. Incidentally, the sheath 22 that has been subjected to the terminal processing is, for example, set to be slightly longer than the exterior member 16.

Another example of the conductive path than the high voltage conductive path 15 may include a high voltage coaxial composite conductive path 72 that will be described later with reference to FIG. 13. Further another example of the conductive path may include a well-known shield wire or the like. Incidentally, it will go well if the number of conductive paths is at least one. The number of conductive paths may be plural.

In FIG. 2, FIG. 3A and FIG. 3B, the exterior member 16 is a tube body made of resin to cover the aforementioned high voltage conductive path 15, and the exterior member 16 is formed into a shape that is long enough to accommodate the high voltage conductive path 15 and thick enough to protect the same. In addition, the exterior member 16 is also formed into a shape that can keep the high voltage conductive path 15 away from moisture (or waterproof). The exterior member 16 is formed into a long shape in the first embodiment.

In the first embodiment, the exterior member 16 is formed into a circular shape in section. Incidentally, the sectional shape of the exterior member 16 is simply an example. As will be described later in a second embodiment, the sectional shape of the exterior member 16 may be an elliptical shape, an oval shape or a rectangular shape. The exterior member 16 includes thick portions 25 whose thickness is increased, and thin portions 26 whose thickness is reduced on the contrary to the thick portions 25. In addition, the exterior member 16 includes a plurality of flexible tube portions 27 that have flexibility, and a plurality of non-flexible tube portions 28 that do not have flexibility as high as the flexible tube portions 27 (or that have lower flexibility than the flexible tube portions 27).

The flexible tube portions 27 and the non-flexible tube portions 28 are molded integrally out of resin so as to have a linear shape as a whole when the flexible tube portions 27 are not bent. The flexible tube portions 27 and the non-flexible tube portions 28 are disposed alternately and continuously in the tube axis direction.

The flexible tube portions 27 are disposed in positions corresponding to the shape of attachment to a vehicle (the shape of a destination where the wire harness should be wired, such as a fixing target 47 that will be described later). In addition, the flexible tube portions 27 are formed to be long in accordance with the shape of attachment to the vehicle. Incidentally, when the plurality of flexible tube portions 27 are made different in length in the tube axis direction, the flexible tube portions 27 can be bent with required lengths in accordance with the shape of attachment to the vehicle. The flexible tube portions 27 arranged thus can be bent at desired angles respectively during transportation of the wire harness and during wiring path arrangement on the vehicle as will be described later.

Each flexible tube portion 27 can be bent into a curved shape. Not to say, the flexible tube portion 27 can be also resumed to its original straight shape.

In the first embodiment, each flexible tube portion 27 is formed into a bellows tube shape. Incidentally, the shape of the flexible tube portion 27 is not limited especially but it will go well if it has flexibility. Specifically, the flexible tube portion 27 is formed to have concave portions 29 and convex portions 30 extending circumferentially so as to make the concave portions 29 and the convex portions 30 continuous and alternate in the tube axis direction.

The flexible tube portions 27 include wiring path arrangement flexible tube portions 31 (see FIG. 11) that can be bent during the wiring path arrangement and transportation flexible tube portions 32 (see FIG. 10) that can be bent during the wire harness transportation. Incidentally, the flexible tube portions 27 may be disposed in parts that do not have to be bent.

The exterior member 16 is formed into a shape in which the flexible tube portions 27 are disposed on its terminal sides. In addition, the exterior member 16 is formed to be so long that end portions of the flexible tube portions 27 disposed on the terminal sides can extend to the vicinities of the shield connectors 17 (see FIG. 8) respectively. Incidentally, the vicinity of the shield connector 17 means an enough long distance from the shield connector 17 not to hinder the work of electric connection to the inverter unit 4 (see FIG. 1) etc. or an enough long distance from the shield connector 17 not to hinder the work of terminal processing on the high voltage conductive path 15. Since each flexible tube portion 27 has flexibility as described above, the flexible tube portion 27 can be extended up to a significantly close distance from the shield connector 17.

Flexible waterproof members extending to the shield connectors 17 (see FIG. 10 and FIG. 11) are attached to the end portions of the flexible tube portions 27 disposed on the terminal sides, respectively. For example, boots 33 (see FIG. 10 and FIG. 11) made of rubber, or the like, may be used as the waterproof members. The boots 33 are attached to cover terminal portions 34 (see FIG. 10 and FIG. 11) of the high voltage conductive path 15 extracted from the end portions of the flexible tube portions 27, or the opening portions of the end portions of the flexible tube portions 27, respectively. Incidentally, the waterproof members are attached optionally, but it will go well if they are absent. For example, the boots 33 may be replaced by tape winding portions consisting of waterproof tape that is wound.

Water stop members are attached to, of the plurality of flexible tube portions 27 in the exterior member 16, the flexible tube portions 27 disposed in accordance with the positions of the aforementioned through holes in the vehicle underfloor 11 (see FIG. 1), respectively. The water stop members are watertight against the outer surfaces of the flexible tube portions 27 and also watertight against the through holes. For example, grommets 19 (see FIG. 10 and FIG. 11) made of rubber, or the like, may be used as the water stop members. The grommets 19 are attached as members for preventing moisture from entering through the through holes.

The exterior member 16 is formed into such a shape that the portions where the flexible tube portions 27 are disposed serve just like corrugated tubes. To say other words, the exterior member 16 is formed into a shape in which corrugated tubes are provided partially. Since the exterior member 16 includes a portion whose shape is similar to that of a corrugated tube as described above, the exterior member 16 can be regarded as a "corrugated tube", a "partially shaped corrugated tube" or the like.

The exterior member 16 is formed into a shape provided with no slit (or unslitted) in its tube axis direction. The reason why no slit is provided is to prevent moisture from leaking into the exterior member 16, to thereby improve waterproofness. Another reason is to prevent the high voltage conductive path 15 from sticking out in a bent portion. Further another reason is to increase the rigidity of the exterior member 16 itself.

Each non-flexible tube portion 28 includes a non-flexible tube portion body 36 and an attachment portion 37. The non-flexible tube portion body 36 is formed as a part that cannot be bent in a packed state that will be described later, during transportation or during wiring path arrangement. The part that cannot be bent means a part that is not aggressively provided with flexibility. The non-flexible tube portion body 36 is formed into a straight tube shape that is circular in section. The sectional shape of the non-flexible tube portion body 36 is not limited to the aforementioned sectionally circular shape but may be an elliptical shape, an oval shape or a rectangular shape.

The non-flexible tube portion 28 is formed into a straight tube shape as illustrated. Therefore, the non-flexible tube portion 28 can be also regarded as a "straight tube portion", a "straight portion" or the like. The non-flexible tube portion 28 is formed in a rigid part, as compared with the flexible tube portion 27. The non-flexible tube portion 28 is also formed into a position or a length corresponding to the aforementioned shape of attachment to the vehicle.

As one of the non-flexible tube portions 28, the exterior member 16 has an underfloor non-flexible tube portion 38 wired on the vehicle underfloor 11 (see FIG. 1). Since the underfloor non-flexible tube portion 38 is wired on the vehicle underfloor 11 (for example, wired to extend along a lean hose), the underfloor non-flexible tube portion 38 is formed to be long. The underfloor non-flexible tube portion 38 is a type of non-flexible tube portion 28. A plurality of attachment portions 37 are also formed in the underfloor non-flexible tube portion 38 configured thus.

The attachment portions 37 are formed as parts to which the clamps 18 (see FIG. 10 and FIG. 11) can be attached. In addition, the attachment portions 37 are formed integrally (that is, molded integrally) with the non-flexible tube portion bodies 36. Since the exterior member 16 is made of resin, the attachment portions 37 can be easily integrated with the non-flexible tube portion bodies 36. Incidentally, the attachment portions 37 are provided in parts to which the clamps 18 should be attached, while some non-flexible tube portions 28 are not provided with the attachment portions 37. Further, the attachment portions 37 in the first embodiment are formed at a plurality of places of the exterior member 16, though not limited thereto.

Each attachment portion 37 includes a pair of movement restriction portions 39 and an attachment/detachment portion 40. The paired movement restriction portions 39 are disposed and formed in positions corresponding to opposite sides of a clamp 18 (see FIG. 10 and FIG. 11). The paired movement restriction portions 39 are formed as parts for restricting movement of the clamp 18 in the tube axis direction. In addition, the paired movement restriction portions 39 are also formed as parts for recognizing the attachment position of the clamp 18. In the first embodiment, each of the paired movement restriction portions 39 is formed into a ring-like flange shape. Specifically, the movement restriction portion 39 is formed into a shape that protrudes from an outer surface 41 of the non-flexible tube portion body 36 and that is convex in the circumferential direction. Incidentally, the shape of the movement restriction portion 39 is simply an example.

In order to absorb dimensional deflection of a fixed position during wiring path arrangement, it is effective that a slightly wide interval is secured between the paired movement restriction portions 39 at a predetermined place. Due to the slightly wide interval, the clamp 18 (see FIG. 10 and FIG. 11) can be allowed to slide and move. As a result, the aforementioned dimensional deflection can be absorbed.

In the first embodiment, each of the paired movement restriction portions 39 is formed so that the protruding height or the width of the movement restriction portion 39 can agree with the protruding height or the width of each convex portion 30 in the flexible tube portion 27. Incidentally, the shape of the movement restriction portion 39 is simply an example.

Each attachment/detachment portion 40 is formed as a part to which a clamp 18 (see FIG. 10 and FIG. 11) can be attached directly. The outer surface 41 located between the paired movement restriction portions 39 corresponds to the attachment/detachment portion 40, which is formed as a curved surface. Incidentally, in order to surely prevent the clamp 18 from rotating after the clamp 18 is attached, it is effective that a part biting into the attachment/detachment portion 40 that is a curved surface is provided on the clamp 18 side. In addition, it is also effective that a rotation stopper structure such as irregularities is added to the attachment portion 37 or the clamp 18.

The thick portions 25 and the thin portions 26 may be formed in any flexible tube portion 27 or in any non-flexible tube portion 28 or formed in both the flexible tube portion 27 and the non-flexible tube portion 28. That is, the thick portions 25 and the thin portions 26 are formed in at least one of the plurality of flexible tube portions 27 and the non-flexible tube portions 28.

The thick portions 25 and the thin portions 26 are formed and disposed to be arranged in the tube axis direction in at least one of the flexible tube portions 27 and the non-flexible tube portions 28 where the thick portions 25 and the thin portions 26 are formed. The thick portions 25 and the thin portions 26 are formed to secure at least lengths in the tube axis direction corresponding to the regions that should be thickened and thinned respectively. The thick portions 25 and the thin portions 26 are formed along the entire periphery.

Here, some examples of layouts of the thick portions 25 and the thin portions 26 will be shown. In an example shown in FIG. 3B, a thin portion 26 is formed and disposed in an end portion of a non-flexible tube portion 28. The end portion of the non-flexible tube portion 28 is a part that is connected to a flexible tube portion 27.

When the thin portion 26 is formed and disposed in the end portion of the non-flexible tube portion 28, the part where the flexible tube portion 27 and the non-flexible tube portion 28 are connected to each other can be formed with less change in thickness.

In an example of a flexible tube portion 27 shown in FIG. 4, a thick portion 25 and a thin portion 26 are formed and disposed to be arranged in the tube axis direction. When the thick portion 25 and the thin portion 26 are formed in the flexible tube portion 27 with flexibility as shown in FIG. 4, it is, for example, possible to partially restrict (or permit) sharp bending.

In an example of a non-flexible tube portion 28 shown in FIGS. 5A and 5B, a thick portion 25 and a thin portion 26 are formed and disposed to be arranged in the tube axis direction. The thick portion 25 serves as a part for enhancing strength or rigidity. On the other hand, the thin portion 26 serves as a part for intending to increase speed in a process relating to resin molding or a part for reducing the usage of a resin material.

For example, a gently inclined taper 35 is formed in the part where the thick portion 25 and the thin portion 26 are connected with each other. The taper 35 is formed as a part of the thin portion 26 in the first embodiment. The taper 35 is effective as a part for preventing the high voltage conductive path 15 (see FIG. 2) from being caught in the connection part between the thick portion 25 and the thin portion 26 when the high voltage conductive path 15 is inserted into the exterior member 16.

Incidentally, the examples shown in FIG. 3B, FIG. 4 and FIG. 5A are examples in which the thick portion 25 and the thin portion 26 are formed without changing the outer diameter. The embodiment is not limited thereto, but the thick portion 25 and the thin portion 26 different in thickness may be formed without changing the inner diameter as shown in FIG. 5B.

Some modifications of the exterior member 16 will be given with reference to FIG. 6A, FIG. 6B and FIG. 7. In the exterior member 16 shown in FIG. 6A, each non-flexible tube portion 28 is formed into a shape having only the non-flexible tube portion body 36. That is, the non-flexible tube portion 28 is formed without the attachment portion 37 (see FIGS. 3A and 3B). The exterior member 16 may be configured thus.

In the exterior member 16 shown in FIG. 6B, the attachment portion 37 is not formed, but a plurality of ribs 42 are instead formed to extend in at least one of the tube axis direction (that is, the longitudinal direction) and the circumferential direction. The plurality of ribs 42 are formed as parts for enhancing rigidity. In addition, the ribs 42 are also formed as parts that can be attached to a clamp 18 (see FIG. 10 and FIG. 11), as parts by which the attachment position of the clamp 18 can be recognized, and as parts that can prevent the clamp 18 from rotating.

Finally, in the exterior member 16 shown in FIG. 7, the flexible tube portions 27 and the non-flexible tube portions 28 are formed to be divided, and then integrated by a means that will be described later or clamps 48. Thus, the flexible tube portions 27 and the non-flexible tube portions 28 are formed into a shape as a single part.

In the exterior member 16 shown in FIG. 7, end portions a, a to d and d of the flexible tube portions 27 and the non-flexible tube portions 28 are connected and formed integrally by a not-shown welding means or a not-shown bonding means, or by taping or the like. Alternatively, end portions a, a to f and f are connected and formed integrally by clamps 48. Alternatively, those end portions may be connected in advance by the aforementioned welding means or the like before the clamps 48 are attached thereto.

Incidentally, the aforementioned division state may be, for example, considered as an example in which a flexible tube portion 27 and a non-flexible tube portion 28 are divided in division lines e and f. In this case, one of the divisions is formed as a thick portion 25 and the other is formed as a thin portion 26. After the thick portion 25 and the thin portion 26 are formed, the thick portion 25 and the thin portion 26 are connected integrally by a not-shown welding means or a bonding means or by taping or the like. In this manner, the flexible tube portion 27 and the non-flexible tube portion 28 are formed with predetermined lengths.

The exterior member 16 that has been described above is produced by the following producing apparatus and the following producing method. The producing apparatus and the producing method will be described below with reference to FIG. 8 and FIG. 9.

In FIG. 8, the reference numeral 51 represents a producing apparatus for molding the exterior member 16 (for example, see FIGS. 3A and 3B, and FIGS. 6A and 6B) out of resin. The producing apparatus 51 (resin molding apparatus) has a resin extruding portion 52, a molding portion 53, a cooling portion 54 and a cutting portion 55.

The molding portion 53 is continued on the downstream side of the resin extruding portion 52. In addition, the cooling portion 54 is continued on the downstream side of the molding portion 53. The cutting portion 55 is disposed at the terminal of the cooling portion 54 (that is, disposed at the terminal of the apparatus) so as to operate to cut the exterior member 16 into a predetermined length.

The resin extruding portion 52 has a hopper 56 serving as a part where a resin material is injected, an extruding portion body 57 following the hopper 56 and extending horizontally, and a dice 58 protruding from an end portion of the extruding portion body 57. The dice 58 has a resin material extrusion port 59. The resin material extrusion port 59 is disposed in an inlet 60 (see FIG. 9) of the molding portion 53.

In FIG. 9, the molding portion 53 is a part that performs resin molding straightly between the inlet 60 and an outlet 61 and includes a pair of molding structure portions 62. The paired molding structure portions 62 are disposed and paired on the opposite left and right sides of a flexible and cylindrical resin material 63 (that is, a resin material) drawn from the resin material extrusion port 59 of the dice 58 (see FIG. 8). The paired molding structure portions 62 are arranged to be able to mold the resin material 63 into a predetermined shape.

Each molding structure portion 62 has timing pulleys 64 that are paired in the traveling direction of the resin material 63, an endless belt 65 that is moved in the arrow direction in FIG. 9 by the paired timing pulleys 64, and a mold block assembly 66 that is attached to the endless belt 65 so that the mold block assembly 66 can move.

The mold block assembly 66 has a plurality of mold blocks 67. Each the mold blocks 67 are arranged without any space in a straight part of the endless belt 65. Each mold block 67 is replaceably fixed to the endless belt 65.

Incidentally, the aforementioned producing apparatus 51 or the aforementioned producing method is simply an example. Alternatively, for example, a blow type one may be used.

In the producing method, the thick portions 25 and the thin portions 26 (see FIGS. 3A and 3B) in the exterior member 16 are formed by variable control on the moving speed of each mold block 67 or variable control on the supply rate of the resin material 63 to each mold block 67. Due to such variable control, the thick portions 25 and the thin portions 26 are formed in the exterior member 16. Thus, the exterior member 16 can be produced in consideration of improvement in performance or improvement in productivity, as compared with that in the background art.

In FIG. 10 and FIG. 11, well-known clamps may be used as the clamps 18 that are attached to the attachment portions 37.

Each clamp 18 has a tube body attachment portion 43 that is formed in accordance with the external shape of the non-flexible tube portion 28 (or the external shape of the attachment/detachment portion 40), and a fixation portion 44 that has a cantilever-like shape continued to the tube body attachment portion 43. Bolt insertion holes 45 are formed in the fixation portions 44 to penetrate the fixation portions 44 respectively. The wire harness 9 is fixed to a fixing target 47 such as the vehicle underfloor 11 through bolts 46 inserted into the bolt insertion holes 45. The shape of the fixing target 47 is simply an example. When the wire harness 9 is attached and fixed to the fixing target 47, wiring path arrangement is completed as shown in FIG. 11.

Well-known shield connectors 17 are provided in both terminals of the wire harness 9 respectively. One of the shield connectors 17 is an inverter-side shield connector, and the other shield connector 17 is a battery-side shield connector. The shield connectors 17 are electrically connected and fixed to terminal portions 34 of the high voltage conductive path 15 extracted from the flexible tube portions 27, respectively. The boots 33 are attached between the end portions of the flexible tube portions 27 and the shield connectors 17 respectively.

Next, production, packing, transportation and wiring path arrangement of the wire harness 9 will be described. First in the process for producing the wire harness 9, the high voltage conductive path 15 is inserted into the exterior member 16 that has been molded into a substantially straight line as a whole. After that, the shield connectors 17 are provided in the terminal portions 34 of the high voltage conductive path 15. Then the clamps 18 are attached correspondingly to the positions of the attachment portions 37. Then the boots 33 and the grommets 19 are attached to predetermined positions of the outer surface of the exterior member 16. As a result of the aforementioned process, producing the wire harness 9 is completed.

When the wire harness 9 that has been produced is bent to fold in parts corresponding to predetermined flexible tube portions 27 as shown in FIG. 10, the wire harness 9 is disposed in a state in which the non-flexible tube portions 28 (the non-flexible tube portions 28 and the underfloor non-flexible tube portion 38 in FIG. 10) are substantially parallel with each other. More specifically, the wire harness 9 is disposed so that the non-flexible tube portions 28 other than the long underfloor non-flexible tube portion 38 can extend along the long underfloor non-flexible tube portion 38 and substantially in parallel therewith. When the wire harness 9 is arranged in such a state, the whole length of the wire harness 9 can be shortened and the wire harness 9 can be packed with a minimum width. That is, the whole of the wire harness 9 is packed in a compact state. The wire harness 9 is transported in the compact state as it is.

When the wire harness 9 is attached and fixed to the fixing target 47 by use of the clamps 18 as shown in FIG. 11, wiring path arrangement is completed. As is understood from the aforementioned configuration and structure, the wire harness 9 can be formed and wired between one shield connector 17 and the other shield connector 17 so as to keep the whole of the high voltage conductive path 15 away from moisture (that is, waterproof)

According to the wire harness according to the first embodiment, as has been described above with reference to FIG. 1 to FIG. 11, the exterior member 16 including the flexible tube portions 27 and the non-flexible tube portions 28 is included as the configuration of the wire harness, and at least one of any flexible tube portion 27 and any non-flexible tube portion 28 includes the thick portions 25 and the thin portions 26. Each thick portion 25 serves as a part for intending increase in strength, increase in rigidity, etc. On the other hand, each thin portion 26 serves as a part for reducing the usage of the resin material (resin material 63) and a part for enhancing flexibility.

Thus, according to the wire harness according to the first embodiment, it is possible to improve the performance of the exterior member 16 or the productivity of the same.

Second Embodiment

Figure 12A:
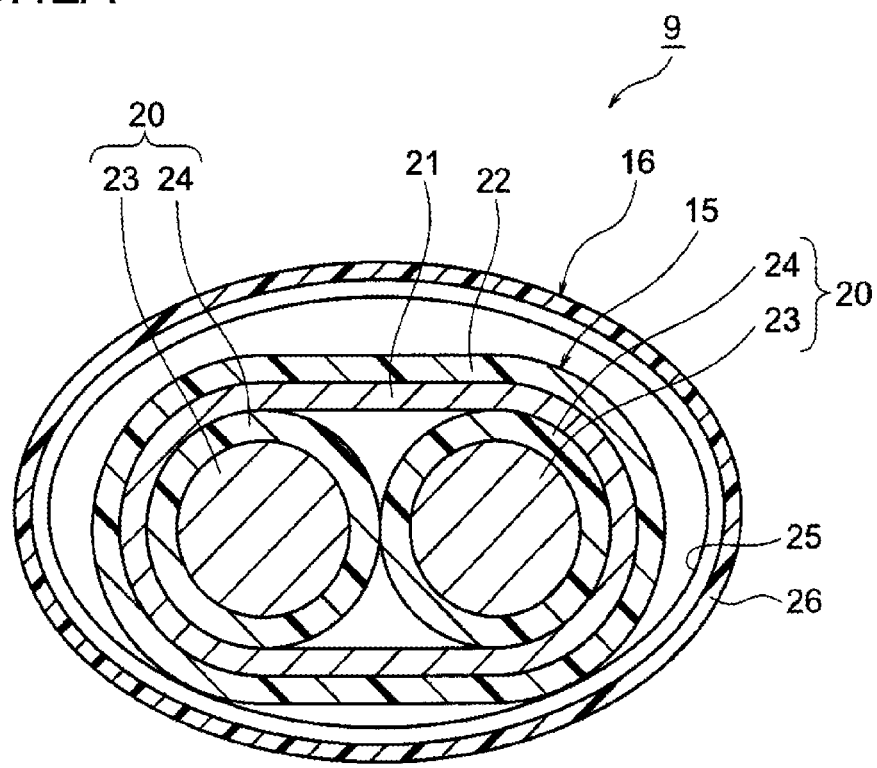
FIG. 12A and FIG. 12B are cross sectional views showing a wire harness according to a second embodiment.
Figure 12B:
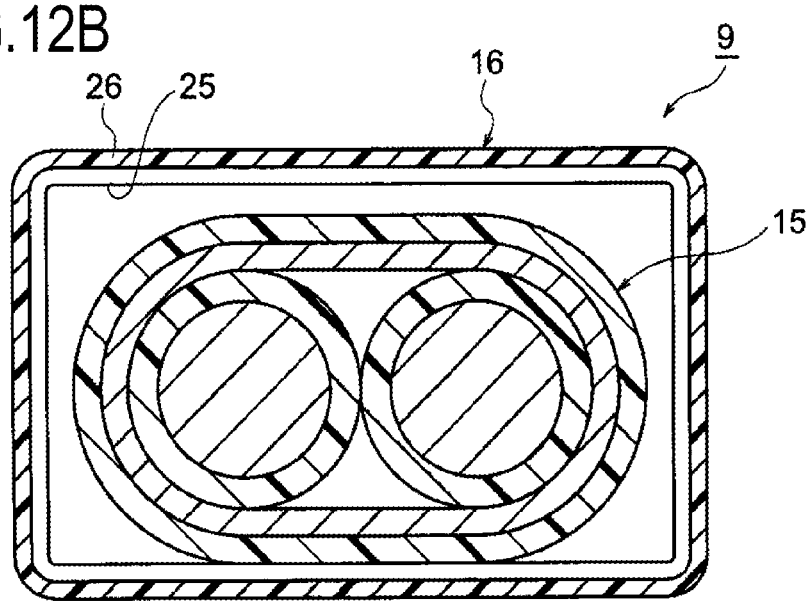

A second embodiment of a wire harness according to the invention will be described below with reference to FIG. 12A and FIG. 12B. FIG. 12A and FIG. 12B are cross sectional views showing the wire harness according to the second embodiment. Incidentally, constituent members fundamentally the same as those in the aforementioned first embodiment are referenced correspondingly, and detailed description thereof will be omitted. In addition, the wire harness according to the second embodiment is wired and used in the same manner as the wire harness according to the first embodiment.

In FIG. 12A and FIG. 12B, the wire harness 9 has a high voltage conductive path 15, an exterior member 16 that accommodates and protects the high voltage conductive path 15, and shield connectors 17 (see FIG. 10) provided at terminals of the high voltage conductive path 15. The exterior member 16 is formed not into a sectionally circular shape as in the first embodiment but into a sectionally elliptic shape (which may be replaced by an oval shape) in accordance with the external shape of the high voltage conductive path 15. Alternatively, the exterior member 16 is formed into a sectionally rectangular shape. The exterior member 16 includes thick portions 25 and thin portions 26.

Since the exterior member 16 is formed into a sectionally elliptic shape or a sectionally rectangular shape, the height of the exterior member 16 becomes lower than that in the first embodiment. Thus, a distance from the ground can be secured when the exterior member 16 is attached and fixed to a vehicle underfloor 11 (see FIG. 1). In addition, since the exterior member 16 is formed into a sectionally elliptic shape or a sectionally rectangular shape, the occupancy of the high voltage conductive path 15 in the internal space can be enhanced so that the heat of the high voltage conductive path 15 can be transmitted to the exterior member 16 easily.

In order to make it easy to transmit the heat to the exterior member 16, the exterior member 16 having a sectionally rectangular shape shown in FIG. 12B is more effective. This is because the contact area with the high voltage conductive path 15 increases.

Not to say, in the wire harness 9 that includes, in its configuration, the exterior member 16 having a sectional shape as described above, there is a similar effect to that in the first embodiment.

Third Embodiment

A third embodiment of a wire harness according to the invention will be described below with reference to FIG. 13. FIG. 13 is a sectional perspective view showing the wire harness according to the third embodiment. Incidentally, constituent members fundamentally the same as those in the aforementioned first embodiment are referenced correspondingly, and detailed description thereof will be omitted. In addition, the wire harness according to the third embodiment is also wired in the same manner as the wire harness according to the first embodiment.

Figure 13:
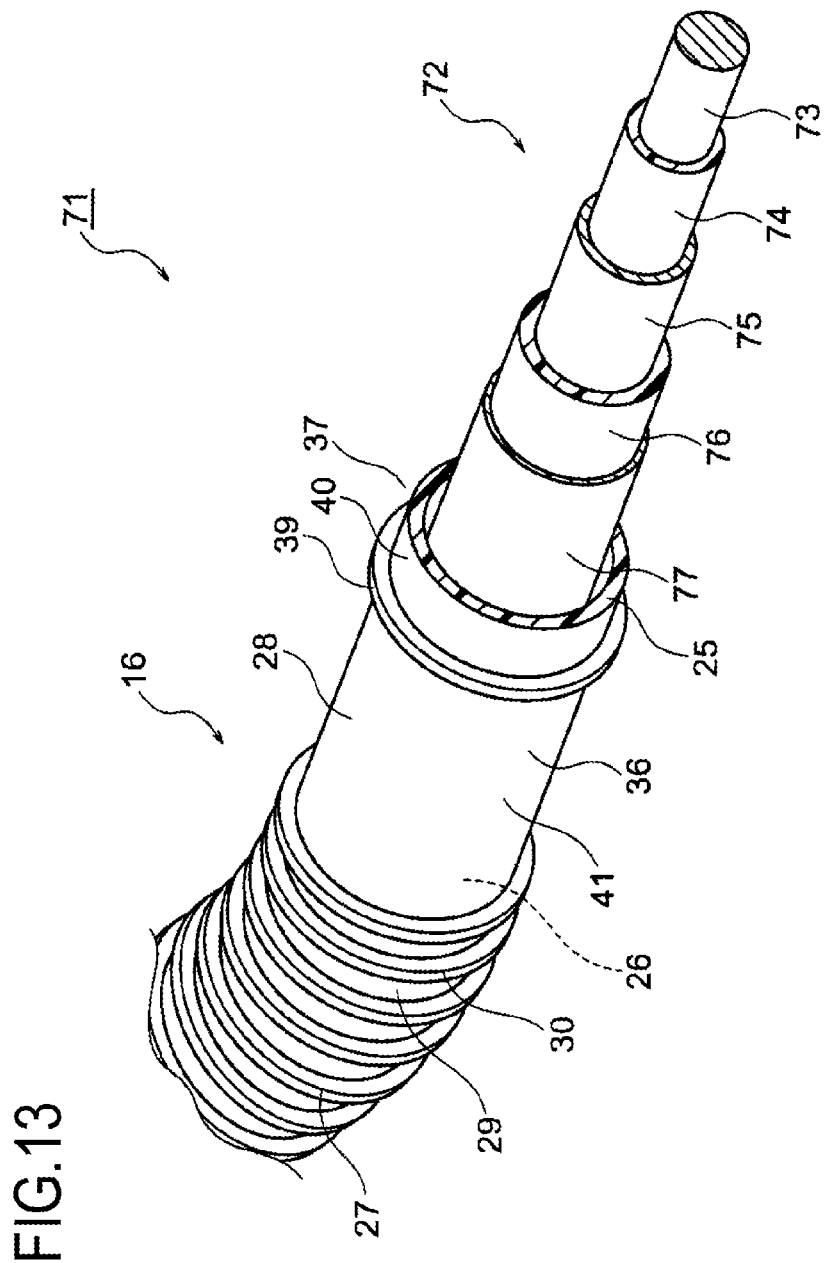
FIG. 13 is a sectional perspective view showing a wire harness according to a third embodiment.

In FIG. 13, a wire harness 71 has a high voltage coaxial composite conductive path 72 that is a high voltage conductive path, an exterior member 16 that accommodates and protects the high voltage coaxial composite conductive path 72, and not-shown shield connectors that are provided at terminals of the high voltage coaxial composite conductive path 72. The exterior member 16 includes thick portions 25 and thin portions 26.

The high voltage coaxial composite conductive path 72 is arranged to bear both a plus circuit and a minus circuit by itself. That is, the high voltage coaxial composite conductive path 72 is arranged to include circuits of two systems. Specifically, the high voltage coaxial composite conductive path 72 has a first conductive path 73, a first insulator 74, a second conductive path 75, a second insulator 76 and a shield member 77. The first conductive path 73 is circular in section and is located at the center of the high voltage coaxial composite conductive path 72. The first insulator 74 covers the outer circumference of the first conductive path 73 with a predetermined thickness. The second conductive path 75 is provided on the outer side of the first insulator 74. The second insulator 76 covers the outer circumference of the second conductive path 75 with a predetermined thickness. The shield member 77 is cylindrical and in close contact with the outer surface of the second insulator 76. Incidentally, the high voltage coaxial composite conductive path 72 may further include a sheath that covers the outer circumference of the shield member 77 with a predetermined thickness.

The shield member 77 is made of a well-known braid, metal foil, or the like. Although the shield member 77 is arranged to belong to the configuration of the high voltage coaxial composite conductive path 72 as described above, the shield member 77 may be arranged as follows. That is, the shield member 77 may be arranged to be slightly loosely fitted to the second insulator 76. The shield member 77 may be formed into a cylindrical shape so that the shield member 77 can be brought into close contact with the outer surface of the second insulator 76, or the shield member 77 may be formed into a tape-like or sheet-like shape so that the shield member 77 can be wound on the outer surface of the second insulator 76 and in close contact therewith.

Although the high voltage coaxial composite conductive path 72 has two systems in the embodiment, the high voltage coaxial composite conductive path 72 is not limited thereto. The high voltage coaxial composite conductive path 72 may have three systems . . . , or n systems. The high voltage coaxial composite conductive path 72 can have n systems if circuits are added outward to keep the configuration as a single coaxial path.

Also in the third embodiment, not to say, there is a similar effect to that in the first embodiment.

It is a matter of course that various other changes may be carried out on the invention without changing the gist of the invention.

According to an example of a modification, heat reflecting portions that reflect heat from the outside are provided at a plurality of places in the outer surface of the exterior member 16 according to any one of the first to third embodiments. According to another example, identification portions by which high voltage can be recognized are provided all over the outer surface of the exterior member 16 or at a plurality of desired places thereof.

The wire harness and the exterior member of the wire harness according to each embodiment will be summarized below.

(1) A wire harness 9 according to the embodiment includes at least one conductive path (high voltage conductive path 15), and an exterior member 16 having a tubular shape and made of resin to cover the conductive path. The exterior member 16 includes flexible tube portions 27 with flexibility, and non-flexible tube portions 28 with low flexibility lower than the flexibility of the flexible tube portions 27. At least one of any flexible tube portion 27 and any non-flexible tube portion 28 has a thick portion 25 and a thin portion 26 which are arranged in a tube axis direction. The thick portion 25 and the thin portion 26 are different in thickness.

(2) In the wire harness 9 according to the embodiment, the exterior member 16 is formed by integral molding of the flexible tube portions 27 and the non-flexible tube portions 28.

(3) In the wire harness 9 according to the embodiment, the exterior member 16 may be designed to be formed by integration of the flexible tube portions 27 and the non-flexible tube portions 28 that have been formed to be divided.

(4) In the wire harness 9 according to the embodiment, the thin portions 26 are disposed in parts of the non-flexible tube portions 28 to which the flexible tube portions 27 are connected to respectively.

(5) A method for producing an exterior member of a wire harness according to the embodiment includes the step of molding the exterior member (exterior member 16) of the wire harness out of resin. The exterior member has a tubular shape and covers at least one conductive path (high voltage conductive path 15). The exterior member includes flexible tube portions 27 with flexibility and non-flexible tube portions 28 with low flexibility lower than the flexible tube portions 27. At least one of any flexible tube portion 27 and any non-flexible tube portion 28 has a thick portion 25 and a thin portion 26 which are arranged in a tube axis direction. The thick portion 25 and the thin portion 26 are different in thickness. Variable control is performed on a moving speed of each mold block 67 for molding the thick portion 25 and the thin portion 26 when the thick portion 25 and the thin portion 26 are formed.

(6) A method for producing an exterior member of a wire harness according to the embodiment includes the step of molding the exterior member (exterior member 16) of the wire harness out of resin. The exterior member has a tubular shape and covers at least one conductive path (high voltage conductive path 15). The exterior member includes flexible tube portions 27 with flexibility and non-flexible tube portions 28 with low flexibility lower than the flexibility of the flexible tube portions 27. At least one of any flexible tube portion 27 and any non-flexible tube portion 28 has a thick portion 25 and a thin portion 26 arranged in a tube axis direction. The thick portion 25 and the thin portion 26 are different in thickness. Variable control is performed on a supply rate of a resin material (resin material 63) to each mold block 67 for molding the thick portion 25 and the thin portion 26 when the thick portion 25 and the thin portion 26 are formed.

A wire harness and a method for producing an exterior member of the wire harness according to the invention are useful because it is possible to provide a wire harness capable of improving the performance of the exterior member and improving the productivity of the same, and a method for producing the exterior member.

What is claimed is:

1. A wire harness comprising:
   at least one conductive path;
   an exterior member having a tubular shape and made of resin, the exterior member covering the conductive path, and the exterior member having an outer surface; and
   a clamp including a tube attachment portion and a fixation portion, the tube attachment portion engages the outer surface of the exterior member, and the fixation portion is cantilevered to the tube attachment portion,
   wherein the exterior member includes a flexible tube portion with corrugations having flexibility and a non-flexible tube portion without corrugations having low flexibility lower than the flexibility of the flexible tube portion; and
   wherein the flexible tube portion includes a flexible thick portion defining a first wall thickness and a flexible thin portion defining a second wall thickness thinner than the first wall thickness,
   the non-flexible tube portion includes a non-flexible thick portion defining a third wall thickness and a non-flexible thin portion defining a fourth wall thickness thinner than the third wall thickness, the non-flexible thick portion and the non-flexible thin portion are arranged in a tube axis direction, the flexible tube portion is disposed on a terminal side of the exterior member with respect to the non-flexible tube portion, the non-flexible tube portion includes a pair of convex members that protrude from the exterior surface of the exterior member, and the clamp is located between the convex members, the non-flexible thick portion includes a first non-flexible thick portion and a second non-flexible thick portion, and the non-flexible thin portion is between the first non-flexible thick portion and the second non-flexible thick portion in the tube axis direction, and the clamp is spaced away from at least one of the non-flexible thick portion and the non-flexible thin portion.

2. The wire harness according to claim 1, wherein the exterior member is formed by integral molding of the flexible tube portion and the non-flexible tube portion.

3. The wire harness according to claim 1, wherein the exterior member is formed by integration of the flexible tube portion and the non-flexible tube portion that have been formed to be divided.

4. The wire harness according to claim 1, wherein the non-flexible thin portion is disposed in a part of the non-flexible tube portion to which the flexible tube portion is connected.

5. The wire harness according to claim 1, wherein the non-flexible thick portion is disposed in a part of the non-flexible tube portion to which the flexible tube portion is connected.

6. The wire harness according to claim 1, wherein the flexible thick portion and the flexible thin portion are formed with unchanging outer diameters.

7. The wire harness according to claim 1, wherein the non-flexible thick portion and the non-flexible thin portion are formed with unchanging outer diameters at locations that are separate from the pair of convex members of the non-flexible tube portion.

8. The wire harness according to claim 1, wherein the non-flexible thick portion is formed with straight walls.

9. The wire harness according to claim 1, wherein the flexible tube portion includes a first flexible tube portion and a second flexible tube portion, and the non-flexible tube portion is between the first flexible tube portion and the second flexible tube portion in the tube axis direction.

* * * * *